(12) United States Patent
Sung et al.

(10) Patent No.: US 6,424,583 B1
(45) Date of Patent: Jul. 23, 2002

(54) SYSTEM AND MEASURING ACCESS TIME OF EMBEDDED MEMORIES

(75) Inventors: Nai-Yin Sung, Hsinchu; Tsung-Yi Wu, Chang-Hua; Meng-Fan Chang, Taipei; Hsien-Te Chen, Hsin-Chu, all of (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/726,729

(22) Filed: Nov. 30, 2000

(51) Int. Cl.[7] ............................................. G11C 7/00
(52) U.S. Cl. ........................................ 365/201; 365/194
(58) Field of Search ............................. 365/201, 194; 711/167; 714/721

(56) References Cited

U.S. PATENT DOCUMENTS 6,266,749 B1 * 7/2001 Hashimoto et al. ......... 711/167

* cited by examiner

Primary Examiner—Vu A. Le
(74) Attorney, Agent, or Firm—Randy W. Tung

(57) ABSTRACT

A BIST controller and a separate measurement circuit are used to determine the maximum time period for accessing data stored in an embedded integrated circuit memory. The BIST controller includes a finite state controller for controlling the state of said BIST, a pattern generator for generating a patterned stimulus to be applied to the memory, and a comparator for comparing the response of said memory to said stimulus, to a reference response. The measurement circuit includes a pair of logic circuits for respectively operating on "1's" and "0's" data read from the memory, and a plurality of time delay elements that introduce time delays in the data prior to delivery to the logic circuits.

16 Claims, 4 Drawing Sheets

SYSTEM AND MEASURING ACCESS TIME OF EMBEDDED MEMORIES

TECHNICAL FIELD

The present invention broadly relates to built in self test modules for integrated circuits (IC's), and deals more particularly with a system for determining the access time of memories embedded in the IC.

BACKGROUND OF THE INVENTION

As deep submicron ASIC applications (Applications Specific Integrated Circuit) and IC technology continue to evolve, the chips forming these devices contain greater numbers of embedded memories. Constant improvements in memory technology, including dynamic random access memory (DRAM) and static random access memory (SRAM) are providing more bits per chip. This increase in the number of bits stored on a single chip means that there is a corresponding increase in the number of memory cells and circuits that need to be tested per chip. Access times for DRAMs and SRAMs have also become shorter. This places demands on testing for higher speeds of operation.

In order to conform the functionality of chips before they are shipped, electronic testers are employed to test the functionality of each chip with the increasing complexity of IC circuitry and density, and shorter access times for memories, the testers must operate at higher frequencies and signal rates in order to confirm the faster operation of the chips.

In the past, chips have been tested using external automatic test equipment at the manufacturing site. These external test systems employ an external test pattern as a stimulus, and apply the patterns to the chips under test. The tester examines the chip's response, and compares it against known responses stored as part of the test pattern data. Because of the time required to connect and disconnect each chip to the external tester, the semiconductor manufacturing industry has resorted to so-called built in self tests (BIST) modules that are placed directly on the IC chip. BIST modules consist of circuitry formed on the chip that surrounds the device or circuit under test. Typical BISTs implement a finite state machine (FSM) to generate a test stimulus. This test stimulus is applied to the device or circuit under test, and the response is then analyzed and compared against reference standards. The BIST module therefore typically includes a controller, a data generator and a data analyzer. This module interfaces with higher level systems on the chip. In a system mode of operation, system data is passed directly to core circuitry (in the case of a memory), essentially bypassing the BIST module. However when switched to a test mode, the BIST module is activated to perform self test functions on a device, such as an SRAM, in order to perform a pass/fail test program. Common tests performed by BIST modules include a Marching test, a Checkerboard test, or a unique address test. A number or other tests are possible, but in any event, following each test, a pass/fail result is delivered from the BIST to the tester.

As IC's become more widespread and embedded core memories possess shorter access times, it becomes more difficult to accurately measure access times, even using a BIST module. Further complicating the task of measuring access times is that the margins between signals continue to decrease as the overall speed of chip circuitry continues to increase. As will be discussed later in more detail, the current technique for measuring access time of embedded core memories is a trial and error approach in which a test must be repeated many times in order to determine the precise relative timing of signals that reveal the access time of each memory address.

It would therefore be desirable to provide a BIST module that automatically measures embedded memory access time more accurately during a shorter test intervals compared to prior memory test systems and BIST modules. The present invention is directed toward satisfying this need.

SUMMARY OF THE INVENTION

According to one aspect of the invention, a system is provided for determining the access time of a memory forming part of an integrated circuit. The system includes a built in self test circuit formed on the integrated circuit chip for testing a memory, and means on a chip coupled with the BIST for measuring the access time of the memory. The measuring means includes logic means coupled with the BIST and the memory for operating on data represented by "1's" and "0's" bits accessed from a memory, and delay means for delaying the delivery of the data from the memory to the logic means. The logic means include separate sets of logic circuits for operating on the data respectively represented by the "0's" and "1's". The delay means includes first and second sets of delay elements for delaying the delivery of the "1's" and "0's" to the corresponding logic circuits. The BIST preferably includes a finite state controller for controlling the state of the BIST, a pattern generator for generating a patterned stimulus to be applied to the memory and a comparator for comparing the response of the memory to the stimulus to a referenced response.

According to another aspect of the invention, a method is provided for determining the access time of a memory forming part of an integrated circuit. The method broadly includes the steps of writing data into the memory at a first memory address; commencing a read cycle in which data is read from the memory at the first address; introducing a time delay in the data being read; determining the total time required to read the data from the memory at the first address location; and, calculating the access time based on the total time and the delay time. The introduction of a time delay in reading the data is preferably achieved by passing the read data through a delay element.

BRIEF DESCRIPTION OF THE DRAWINGS

In the drawings, which form an integral part of the specification, and are to be read in conjunction therewith, and in which like components are used to designate identical components in the virious.

DETAILED DESCRIPTION OF THE PREFERRED EMBODIMENT

Figure 1:
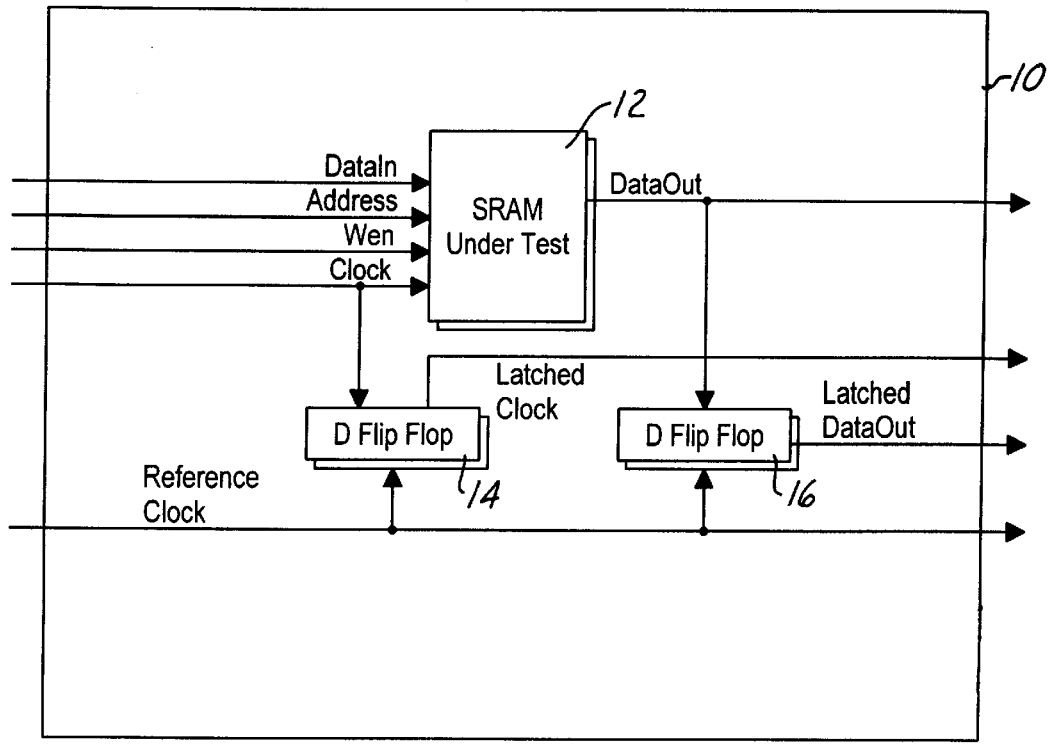
FIG. 1 is a block diagram showing a prior art system for measuring the access time of an embedded memory.

Reference is first made to FIG. 1 wherein a prior art system is shown for measuring the timing of an embedded memory, in this case, a SRAM (Static Random Access Memory) which is embedded on an integrated circuit chip 10 along with other circuit elements (not shown) that utilize the memory 12 to carry out various functions for a particular application. The prior art measurement system shown in Figure employs a pair of D type flip-flops, 14, 16 having their trigger inputs receiving a system reference clock signal. Flip-flop 14 has its data input connected to receive a clock signal that provides timing to the memory 12, while the data input of flip-flop 16 is connected to receive the data output that is read from the memory 12. Whenever the reference clock signal applied to the trigger inputs of flip-flops 14, 16 is on a rising edge, flip-flops 14, 16 latch the current logic level of the clock supplied to memory 12 and the data out signals from memory 12. The latched clock and latched data out signals respectively output from the flip-flops 14, 16 are connected to output pads (not shown) of the IC 10. The time delay of the rising edge of a reference clock signal is progressively adjusted for each test cycle until the clock signal input to the memory 12 changes its logic state from "0" to "1" as detected from the outputs from flip-flops 14, 16.

Consequently, it may be appreciated that the rising edge of the reference clock is delayed T1 ns in order to detect the change of the clock signal by the flip-flops 14, 16, and the rising edge of the reference clock signal is delayed T2 ns in order to detect the change of the logic state of the data out from flip flop 16. The access time of the memory 12 is then calculated by subtracting Ti from T2.

The methodology described above with respect to FIG. 1 must be repeated many times over in a trial and error type technique in order to detect when the clock signal input to the memory 12 changes from a logic state of "0" to "1", and when the data out signal from memory 12 changes its logic state from "0" to "1". This technique is extremely time consuming and requires a skilled engineer to monitor and control the test process. Moreover, different address locations in the memory 12 produce different access times, and different bits in a single address location also have different access times, thereby further complicating the test process. It may be appreciated that this methodology only measures one bit in one address at a time. Since the access time represents a critical delay in the embedded memory, this methodology does not always guarantee that the measured access time represents the maximum access time of the entire memory.

In accordance with the present invention, embedded memory access time can be measured automatically using less engineering resources, and the maximum access time for each bit stored at each address in the memory can be measured more accurately than the prior art technique described above. The present invention achieves these improvements through a unique circuit structure embedded in the integrated circuit, and by using an improved algorithm to measure the memory access time. There are a number of well known algorithms that have been used in the past to test memories, including March C+, March C, March C−, Checkerboard and Walking 1/0. The novel algorithm forming the preferred embodiment is a new and novel improvement to the well known March C+ algorithm which is derived from the modified March C algorithm described by Rob Dekker and Frans Beenker in their 1990 IEEE paper, "a Realistic Fault Model and Test Algorithms For Static Random Access Memories", and is the most popular algorithm for memory testing. This algorithm, which consists of 13 operations (13 n) writes and reads words of "0's" followed by writing/reading words of "1's" in both the descending and ascending addresses as represented below:

↑ Write 0s (to initialize)
↑ Read 0's, Write 1's, Read 1's
↑ Read 1's, Write 0's, Read 0's
- - - -
↑ Read 0's, Write 1's, Read 1's
↑ Read 1's, Write 1's, Read 0's More specifically, the algorithm consists of the following steps:

1. Write 0's to all locations starting at the lowest address (initialization).
2. Read 0 at lowest address, write 1 at lowest address, read 1 at lowest address, repeating this series of operations until reaching the highest address,
3. Read 1 at lowest address, write 0 at lowest address, read 0 at lowest address, repeating this series of operations until reaching the highest address.
4. Read 0 at highest address, write 1 at highest address, read 1 at lowest address, repeating this series of operations until reaching the lowest address.
5. Read 1 at highest address, write 0 at highest address, read 0 at lowest address, repeating this series of operations until reaching the lowest address.

The preceding March C+ algorithm is capable of detecting the following faults: stuck-at, transition, coupling and timing faults at speed.

Figure 2:
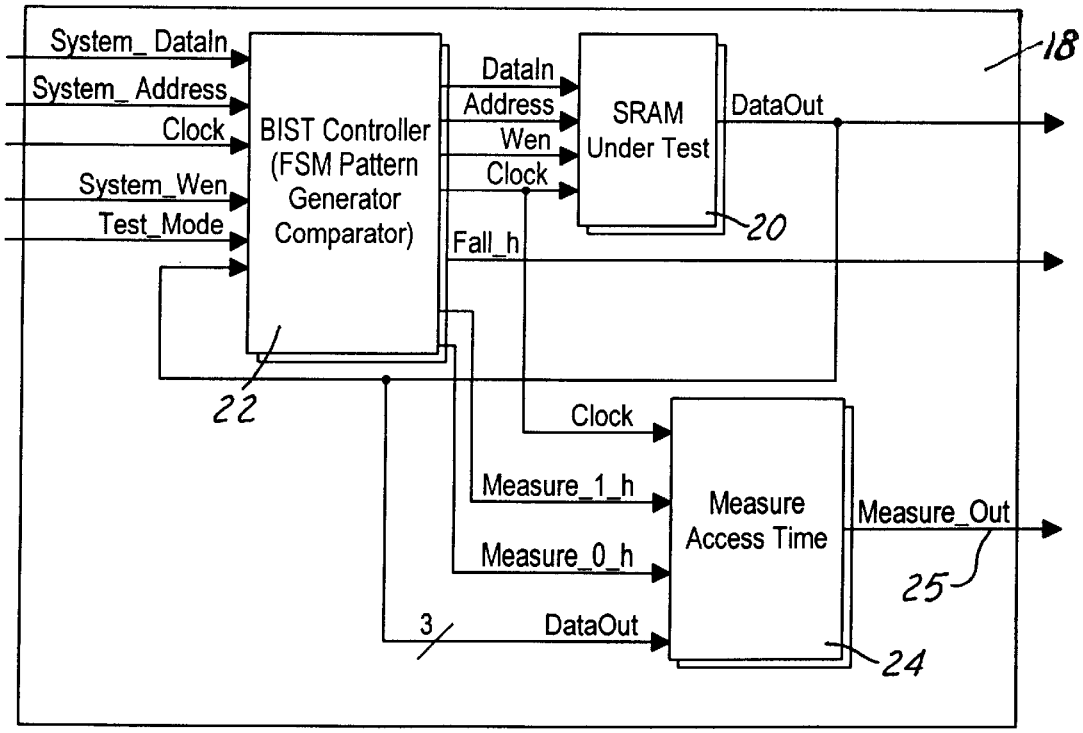
FIG. 2 is a block diagram of a system for determining the access time of an embedded memory in accordance with the preferred embodiment of the invention.
Figure 8:
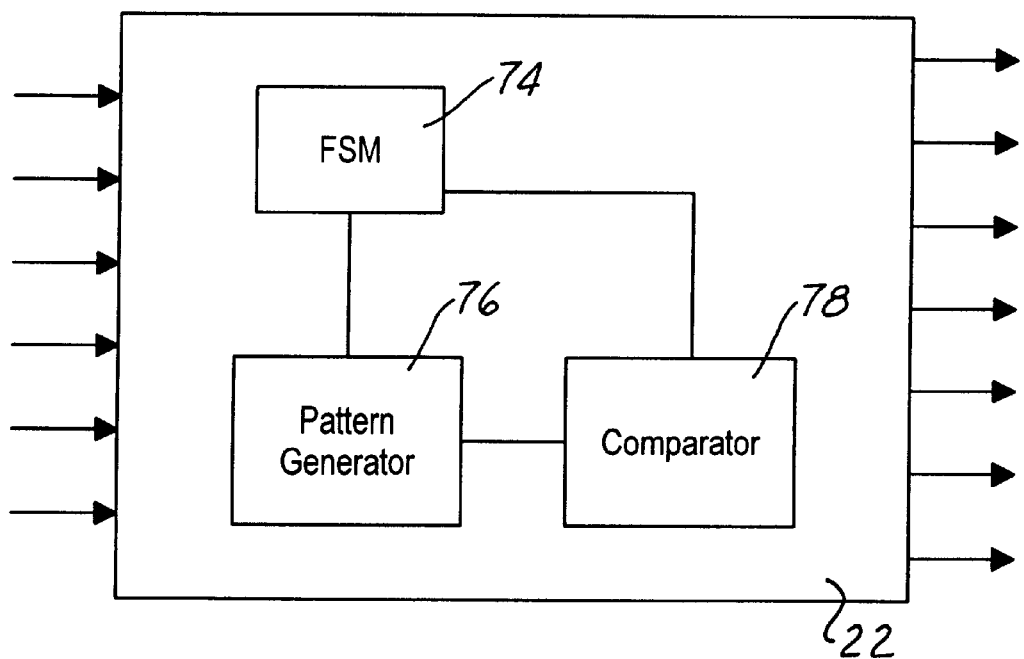

Referring now to FIGS. 2 and 8, an integrated circuit 18 includes an embedded memory 20 as well as a BIST controller 22 and an access time measurement circuit 24. In the illustrated embodiment, memory 20 comprises an SRAM (Static Random Access Memory). The BIST 22 broadly comprises a finite state machine 74, a pattern generator 76 and a comparator 78. The finite state machine 74 comprises a circuit that controls the operational state of the BIST 22. The pattern generator 76 automatically generates patterns or a stimulus that is used to test the memory 20 based upon a selected fault model such as the March C+, March C, March C−, Checkerboard, Walking 1/0, or the improved March C + described herein. A comparator 78 functions to compare the actual response of the memory 20 with a known, stored response representing acceptable results.

The FSM 74, pattern generator 76 and comparator 78 are all conventional hardware components readily available from a variety of well known commercial sources. The FSM 74 controls and selects the operational state of the previously described algorithm, e.g. ↑ Read 0's, Write 1's, Read 1's. After completing one state, the FSM 74 selects the next state. The pattern generator 76 automatically generates the test pattern which is written into the memory 20; in other words. It writes the one's and zero's into the memory 20, based on each state of the algorithm. The comparator 78 compares the values read from the memory 20 with the stored, expected values, thereby determining whether the memory 20 contains a fault.

The access time measurement circuit 24 receives signals from both the BIST 22 and memory 20, and functions to measure the access time of the memory which comprises the time interval between the application of a clock signal to the memory 20 and the output of stored data therein shown as the signal "DataOut".

The signals input to and output from the BIST controller 22 are described as follows:
1. System_DataIn: The system data inputs to the Embedded SRAM.
2. System_Address: The system address inputs to the Embedded SRAM.
3. Clock: The clock to the BIST controller, the Embedded SRAM and Access Time Measuring Circuit.
4. System_Wen: The system write enables that control Embedded SRAM read/write operations.
5. Test_Mode: A signal that enables the BIST controller.
6. Fail_h: The pass/fail flag for the BIST controller.
7. Measure_1_h: A control signal to measure access time for SRAM address store "1".
8. Measure_0_h: A control signal to measure access time for SRAM address store "0".

The signals input to and output from the access measuring circuit 24 are as follows:
1. Clock: The clock to the BIST controller, SRAM Under test and Measure Access Time.
2. Measure_1_h: A control signal to measure access time for SRAM address store "1".
3. Measure_0_h: A control signal to measure access time for SRAM address store "0".
4. DataOut: The data output from the Embedded SRAM.
5. Measure_Out: The signal to measure access time for SRAM address store "1" or "0".

System data and a system address are clocked through the BIST controller to the memory 20, as well as the system clock signal. When the test mode signal input to the BIST controller 22 enables the BIST controller, the measuring circuit 24 is enabled which also is driven by the system clock signal. The data read from memory 20 is fed back to the BIST controller 22 as well as to the measurement circuit 24. In the illustrated embodiment, this data is in the form of a three bit word for each address location in the memory 20. The BIST controller 22 sends enabling signals to the measurement circuit 24 which enables the circuit 24 to measure the access time of "0's" or "13 s" from each address location of the memory 20. The measured access time is output from circuit 24 on line 25 which can be passed to external circuitry if desired to either visually indicate the access time, or to automatic programs which rate the access time as either passed or failed.

Figure 3:
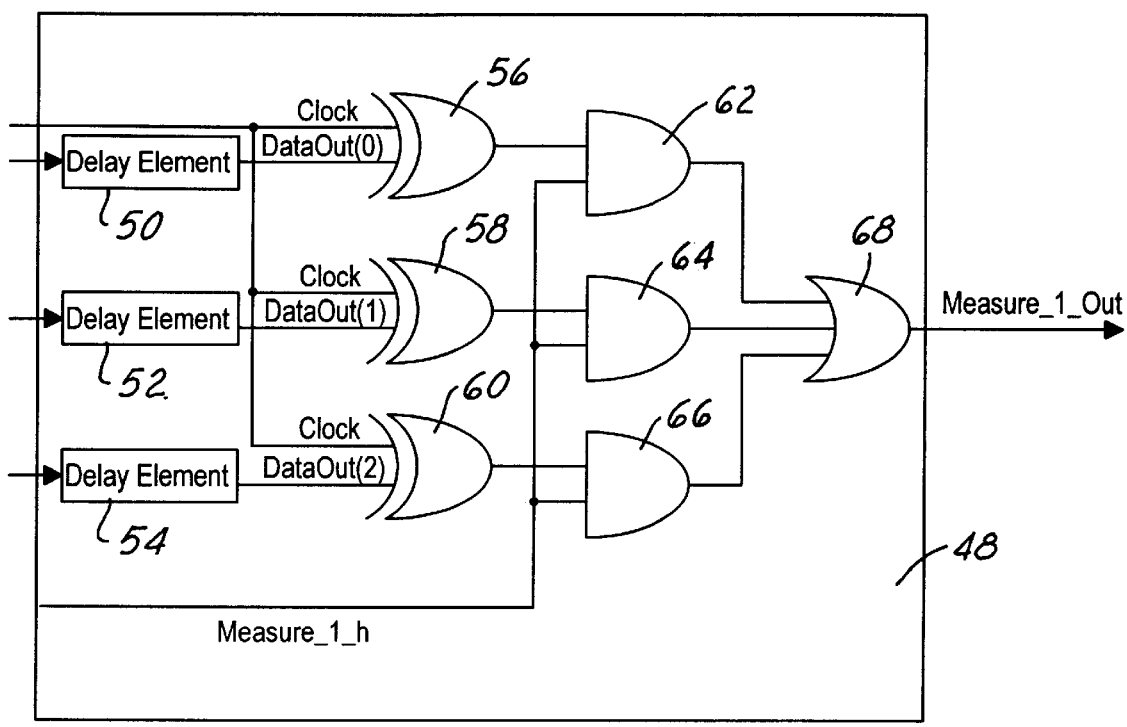
FIG. 3 is a combined block and schematic diagram of a first logic circuit that forms part of the system shown in FIG. 2.
Figure 5:
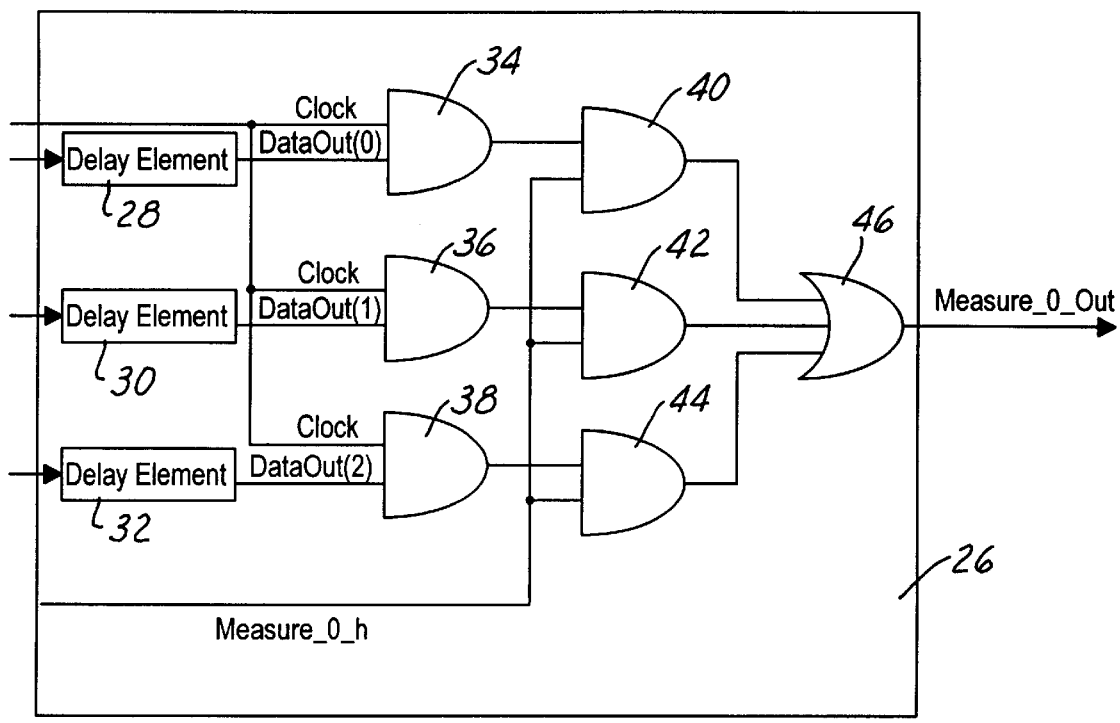
FIG. 5 is a second logic circuit forming part of a system shown in FIG. 2 used in operating on "0's" read from the memory.
Figure 7:
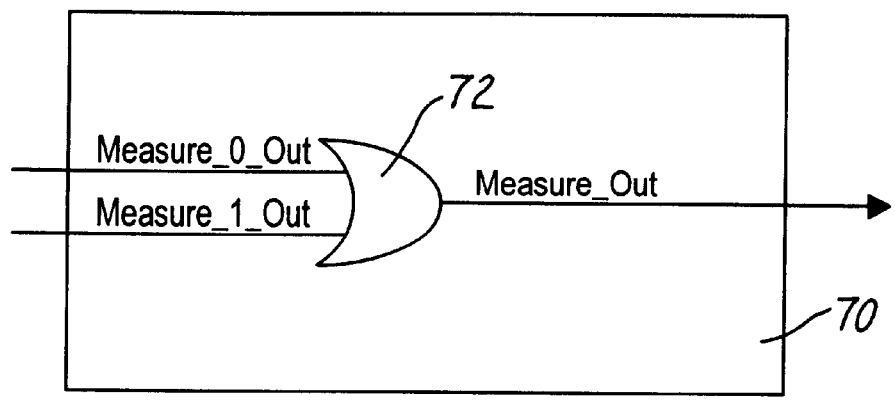
FIG. 7 is a schematic diagram of a logic element forming part of a system shown in FIG. 2; and, FIG. 8 is a block diagram showing the components of the BIST controller depicted in FIG. 2.

The measuring circuit 24 broadly comprises three circuit sections 48, 26, and 70 respectively shown in FIGS. 3, 5 and 7. As shown in FIG. 3, the three bits of data output from the memory 20 are received by the measuring circuit 24 (DataOut) are respectively input to three time delay elements 50, 52 and 54, which may comprise, for example, a number of commercially available components, such as a serial buffer, and invertor or a ring oscillator.

The time delay elements 50–54 function to delay, for a pre-selected time period, the delivery of the data bits to inputs of a first logic array comprising exclusive OR gates 56–60, the second inputs of which receive the system clock signal. The outputs of the exclusive OR gates 56–60 are respectively delivered to one input of AND gates 62–66 which form a second logic array. AND gates 62–66 each have their second inputs connected to receive the Measure 1 h, which consists of a signal developed by the BIST controller 22 that enables a measurement cycle in which the time for accessing "1's" are measured. The outputs of AND gates 62–66 are fed to the inputs of OR gate 68, the output of which output represents the time period for accessing "1's" from a given address location in memory 20. The output of OR gate 68 is delivered to one input of OR gate 72 shown in FIG. 7.

Circuit section 26 (FIG. 5) is broadly similar in structure to circuit section 48, and includes a series of delay elements 28–32 which delay the delivery of "0's" bits to a pair of logic gate arrays. Specifically, "0's" data output from the memory 20 is delivered as three separate bits to delay elements 28–32, which function to delay the delivery of these bits of data to one input of three corresponding AND gates 34–38, the second input to such gates being formed by the system clock signal. The outputs of AND gates 34–38 are respectively delivered to one input of AND gates 40–44 whose second input receives the Measure 0 h consisting of a signal that enables the measuring circuit 24 to measure the time required to access "0's" from each address location in the memory 20. The outputs of AND gates 40–44 are delivered through OR gates 46, whose output represents the time required to access the entire data word from the address location. The output of OR gates 46 is delivered to the second input of OR gate 72 (FIG. 7).

According to a novel method of the present invention, the following improved algorithm is provided which is based on the March C+ discussed previously:

↑ Write 0's (to initialize)

↑ Read 0's, Write 1's, Read 1's (measure the max delay time for address store "1") (Phase 0).

- - - -

↓ Read 1's, Write 0's, Read 0's

↓ Read 1's, Write 0's, Read 0's (measure the max delay time for address store "0")

More specifically, the new algorithm consists of the following detail steps:
1. Write 0's to all locations starting at the lowest address. (initialization)
2. Read 0 at lowest address, write 1 at lowest address. Measure_1_h enable, read 1 at lowest address. Measure_1_Out generate the Tdelay, repeating this series of operations until reaching the highest address.
3. Read 1 at lowest address, write 0 at lowest address, read 0 at lowest address, repeating this series of operations until reaching the highest address.
4. Read 0 at highest address, write 1 at highest address, read 1 at lowest address, repeating this series of operations until reaching the lowest address.
5. Read 1 at highest address, write 0 at highest actress, Measure_h_enable, read 0 at lowest address, Measure_Out generate the Tdelay, repeating this series of operations until reaching the lowest address.

Figure 4:
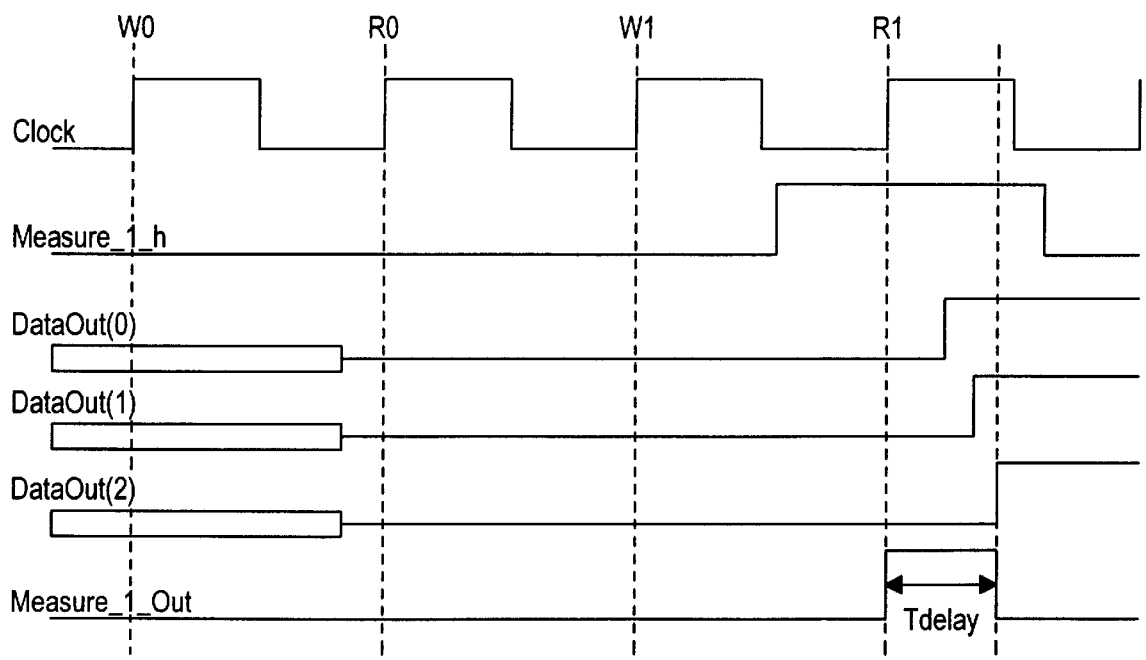
FIG. 4 is a set of timing diagrams showing the relative relationship of signals produced in the system of FIG. 2 when "1's" data are being read from the memory.

The above algorithm can be better understood by referring now to FIG. 4, in combination with FIGS. 2 and 3. The lowest address in memory 20 is initialized by writing "0's" to all locations beginning at the lowest address. Then, at the lowest address, "0's" are read, then "1's" are written into the lowest address. With "1's" present in the lowest memory address, BIST controller 22 issues a Measure _1_h enabling signal that enables the measuring circuit 24 to commence measuring the time required to access all "1's" from the lowest address. FIG. 4 shows the status of the various signals at 4 instants of time: W0, R0, W1 and R1. W0 represents the time when "0's" are written into a given memory location. R0 represents the time when "0's" are read from the same memory address. W1 represents the time when "1's" are written in the memory at the address location, and R1 is the time when the "1's" are begun to get read from the address location. The operation of the BIST controller 22 and measuring circuit 24 are synchronized by the clock signal whose rising edge occurs at W0, R0, W1 and R1. From FIG. 4, it may be seen that the signal enabling "1's" to be read from the memory at the lowest address location (Measure_1_h) occurs prior to R1 and remains present until the access time measurement is completed. With the measurement signal present, the "1's" stored in the lowest address are commenced to be read out at time R1, on the rising edge of the clock signal. The "1's" data are then read out at the lowest address and are delivered to inputs of both the BIST controller 22 and measuring circuit 24. Specifically, as shown in FIG. 3, the three bits of data consisting of "1's" are respectively delivered to the time delay elements 50–54 which in turn function to delay the receipt of this data by exclusive OR gates 56–60. Thus, the delivery of the data to gates 56–60 is delayed relative to the receipt at these gates of the clock signal. This delay is provided in order to make feasible a measurement of access time through the output pads of the IC 18. For example, in connection with 0.25 micron IC processing, the access time of an embedded SRAM is less than 5 ns, while the output pads transistion time is about 3 ns. It is therefore possible to measure the access time through the output pads unless a suitable delay is introduced in the data signals. By increasing the relative delay, it become possible to measure the delay time from the output pads.

As shown in FIG. 3, when the clock signal is present on the input of gates 56–60, but data has not yet been delivered to these gates, the output of gates 56–60 is high. Consequently, the inputs to gates 62–66 are high, causing all three output of gates 62–66 to go high. In this condition, the output of OR gate 68 is high at time period R1 which corresponds to the rising edge of the clock signal. When the first bit of the three bit word read from memory 20 and output from delay element 50, both inputs to exclusive OR gate 56 are high, and the later output is therefore low. However, at this point, the remaining two bits of data have not yet been received by gates 58–60, consequently the output of OR gate 68 remains high. When, however, all three bits of data have been received at the corresponding inputs of gates 56–60, the outputs of all three latter mentioned gates are low, consequently the outputs of AND gates 62–66 are low. The relative timing of the delivery of this data is shown in FIG. 4 where receipt of the last bit of data, DataOut (2) coincides with the falling edge of the Measure_1_Out signal. The Measure_1_Out signal remains high for a period of Tdelay which represents the sum of the memory access time plus the time delay introduced by delay elements 50–54. In other words, the access time is equal to Tdelay less the time delay introduced by delay elements 50–54.

Referring now to the algorithm sequence, the process of writing "0's", writing "1's", reading "1's" and measuring the access times is repeated for each successively higher address until the highest address is reached. Then, this process is repeated, but instead of writing and reading 1's, 0's are written and then read from successively higher address locations, beginning with the lowest address location. Specifically, 1's are read at the lowest address, following which 0's are written at the lowest address which are then read. This series of operations is repeated until the highest address location is reached. Thereafter, "0's" are read at the highest address, following which 1's are written at the highest address and are then read so this series of operations is repeated with successively lower address locations until the lowest address is reached. Finally, at the highest address location, 1's are read, following which 0's are written into memory at the highest address. With 0's having been written at the highest address location, the BIST controller 22 issues the Measure_0_h enabling signal immediately prior to the rising edge of the clock signal at time R0. Then, 0's are read and the Tdelay is generated in the Measure_0_h Out. The sequence of operations is repeated at a sending address location until the lowest address is reached.

Figure 6:
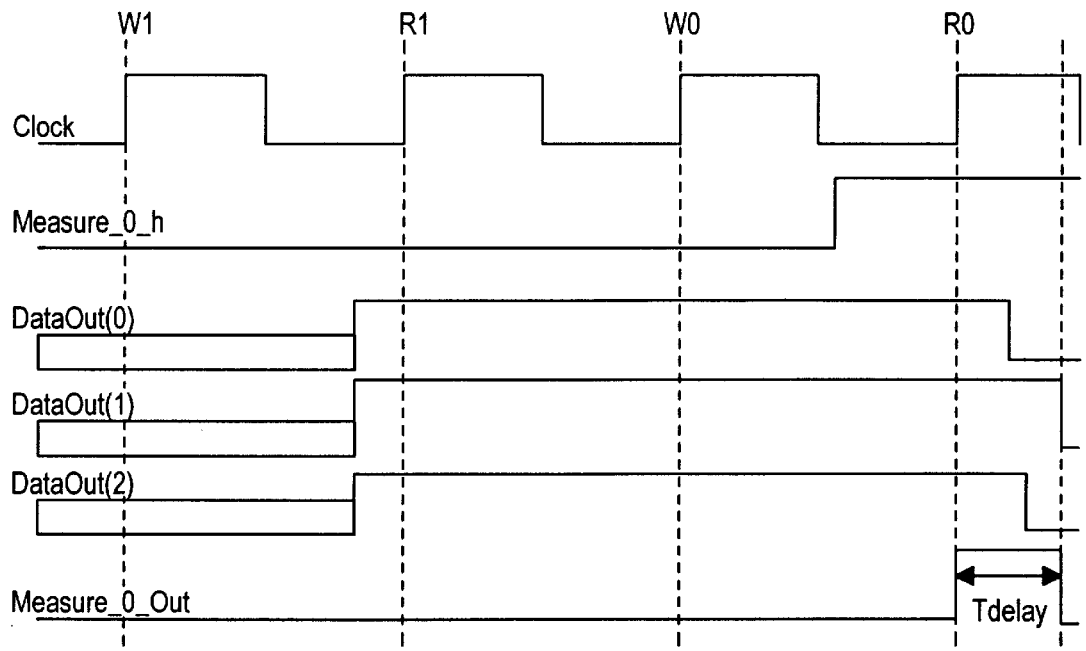
FIG. 6 is a waveform diagram showing the relative relationship of signals produced in the system of FIG. 2 when "0's" are read from the memory.

The process for writing 0's from the memory at each address location is better understood by referring to FIGS. 5 and 6. FIG. 6 is essentially identical to FIG. 4 but depicts the process of reading 0's, rather than 1's. At time R0, on the rising edge of the clock, a clock signal is sent to one input of AND gates 34–38. The 0's are read from the memory at a given address location, and the three bits of data represented by 0's are successively delivered to delay elements 28–32. Before any of the data bits are received by gates 34–38, both inputs to each of such gates is high, consequently their outputs are high. The high outputs of gates 34–38 are respectively delivered to one input of each of a second array of AND gates 40–44, the second input to these latter mentioned gates being formed by the enable signal, Measure_0_h. Consequently, the outputs of gates 40–44 are high, and these high signals are gated through OR gate 46 so that the signal Measure_0_Out is high. When all three data bits (which are low states) have been received at the corresponding inputs of gates 34–38, the output of these latter mentioned gates go low, consequently the output of gates 40–44 and 46 also go low. The coincidence of the receipt of the last data bit, DataOut (1) with the ending of the Measure_0_Out signal can be seen in FIG. 6.

In order to precisely determine the actual access time, it is necessary to know the exact amount of time delay introduces by the delay elements 28-32 and 50-54. This can be accomplished by using a ring oscillator in the integrated circuit 18.

The access time for DataOut (1 to n) is different from each address location. It is vital to extract the maximum access time for DataOut (1 to n) for all the address location in order to determine the maximum access time for the entire memory 20. The logic circuit shown in FIG. 3 measures the maximum Tdelay for DataOut (1 to n) from value 0 to 1.

The logic circuit shown in FIG. 5 generates the Phase 1 algorithim, measures the maximum Tdelay for DataOut (1 to 1) and produces the waveforms shown in FIG. 6.

Beside the different access time between DataOut (1 to n)="1" or "0", the different addresses in the embedded memory 20 have different access times. Based on the above algorithm it not only can measure the maximum delay for DataOut (1 to n)="1" and DataOut (1 to n)="0" but it also can measure all the address access times in the memory 20.

From the foregoing, it is apparent that the system for determining the access time of an embedded memory described above not only provides for the reliable accomplishment of the objects of the invention, but does so in a particularly effective and economical manner. It is recognized, of course, that those skilled in the art may make various modifications or additions chosen to illustrate the invention without departing from the spirit and scope of the present contribution to the art. Accordingly, it is to be understood that the protection sought and to be afforded hereby should be deemed to extend to the subject matter claimed and all equivalents thereof fairly within the scope of the invention.

What is claimed is:

1. A system for determining the access time of a memory forming part of an integrated circuit chip, comprising:

a built in self test circuit (BIST) on said chip for testing said memory, and, means on said chip coupled with said BIST for measuring the access time of said memory, said measuring means includes logic means coupled with BIST and said memory for operating on data represented by "1's" and "0's" accessed from said memory, and delay means for delaying the delivery of said data from said memory to said logic means.

2. The system of claim 1, wherein:

said logic means includes a first logic circuit for operating on "0's" read from said memory, and a second logic circuit for operating on "1's" read from said memory, and said delay means includes a first set of delay elements for delaying the delivery of said "0's" to said first logic circuit, and a second set of delay elements for delaying the delivery of said "1's" to said second logic circuit.

3. The system of claim 2, wherein said first logic circuit includes:

a set of exclusive OR gates each having a first input for receiving a clock signal from said BIST, and a second input for receiving "1's" data read from said memory, a set of AND gates each having a first input for receiving data output from one of said exclusive OR gates, and a second input for receiving a control signal from said CAST enabling the OR gate to gate through data received on its first input.

4. The system of claim 2, wherein said first logic circuit includes an OR gate having a plurality of inputs for receiving the signals output from said AND gates, and having an output for outputting a signal representing the total time required to read "1's" from said memory.

5. The system of claim 2, wherein said second logic circuit includes:

a first of AND gates each having a first input for receiving a clock signal from said BIST, and a second input for receiving a "0" read from said memory, a second set of AND gates each having a first input for receiving data output from one of the AND gates in said first set thereof, and a second input for receiving a control signal from said BIST enabling the AND gate to gate through data received on its first input.

6. The system of claim 5, wherein said second logic circuit includes an OR gate having a plurality of inputs for receiving the signals output from said second sets of AND gates, and having an output for outputting a signal representing the total time required to read "0's" from said memory.

7. The system of claim 1, wherein said BIST includes:

a finite state controller for controlling the state of said BIST, a pattern generator for generating a patterned stimulus to be applied to said memory, and a comparator for comparing the response of said memory to said stimulus to a reference response.

8. A method of determining the access time of a memory forming part of an integrated circuit, comprising the steps of:

(A) writing data into said memory at a first memory address in said memory;

(B) commencing a read cycle in which data is read from said memory at said first address;

(C) introducing a time delay in the data being read in step (B);

(D) determining the total time required to read the data from said memory at said first address location; and, (E) calculating said access time based on the time determined in step (D) and the delay time introduced in step (C).

9. The method of claim 8, wherein step (C) is performed by passing the data read in step (B) through a delay element.

10. The method of claim 9, wherein step (E) is performed by subtracting the time delay introduced in step (C) from the total time determined in step (D).

11. The method of claim 8, wherein steps (A) through (E) are repeated for each of a plurality of addresses in said memory.

12. The method of claim 8, wherein the data written into memory in step (A) is represented by "1's".

13. The method of claim 8, wherein the data written into memory in step (A) is represented by "0's".

14. A method of determining the access time of a memory forming part of an integrated circuit, comprising the steps of:

(A) writing "0's" into each address location in said memory;

(B) at the lowest address in said memory
 (i) reading "0's",
 (ii) writing "1's",
 (iii) commencing a read "1's" measurement cycle,
 (iv) reading "1's",
 (v) introducing a time delay in the "1's" being read in step (B) (iv),
 (vi) determining the total time required to read the "1's", (C) repeating step (B) for each of the remaining address locations in said memory.

15. The method of claim 14, including the steps of:

(D) reading "1's" at the lowest address in said memory, (E) writing "0's" at said lowest address, (F) reading "0's" at said lowest address, (G) repeating steps (D) through (F) from the remaining address locations in said memory, (H) reading "0's" at said highest address, (I) writing "1's" at said highest address, (J) reading "1's" at said lowest address, (F) repeating steps (H) through (J) for each of the remaining address locations in said memory, (G) reading "1's" at said highest address, (H) writing "0's" at said highest address, (I) commencing a read "0's" measurement cycle, (J) reading "0's" at said lowest address, (K) introducing a time delay in the "0's" being read in step (J), (L) determining the total time required to read the "0's" in step (J), (K) repeating steps (G) through (L) for each of the remaining address locations in said memory.

16. The method of claim 15, including the step of calculating said access time using the times determined in steps (B) (vi) and (L).

* * * * *